(12) United States Patent
Sandhu et al.

(10) Patent No.: US 9,568,674 B2
(45) Date of Patent: Feb. 14, 2017

(54) PHOTONIC DEVICE STRUCTURE AND METHOD OF MANUFACTURE

(71) Applicant: MICRON TECHNOLOGY, INC., Boise, ID (US)

(72) Inventors: Gurtej Sandhu, Boise, ID (US); Roy Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/662,524

(22) Filed: Mar. 19, 2015

(65) Prior Publication Data

US 2015/0192737 A1 Jul. 9, 2015

Related U.S. Application Data

(62) Division of application No. 13/776,836, filed on Feb. 26, 2013, now Pat. No. 9,005,458.

(51) Int. Cl.
| | | |
|---|---|---|
| *H01L 21/308* | (2006.01) | |
| *G02B 6/122* | (2006.01) | |
| *G02B 6/136* | (2006.01) | |
| *G02B 6/12* | (2006.01) | |

(52) U.S. Cl.
CPC ......... *G02B 6/1225* (2013.01); *G02B 6/12004* (2013.01); *G02B 6/136* (2013.01); *H01L 21/308* (2013.01); *G02B 2006/12097* (2013.01)

(58) Field of Classification Search
CPC . H01L 21/308; G02B 6/1225; G02B 6/12004; G02B 6/136; G02B 6/12; G02B 6/12061; G02B 6/12097; G02B 6/121; G02B 6/122; G02B 6/1223; G02B 2006/12097

See application file for complete search history.

(56) References Cited

U.S. PATENT DOCUMENTS

| | | | |
|---|---|---|---|
| 7,023,011 B2 | 4/2006 | Atanackovic et al. | |
| 7,625,776 B2 | 12/2009 | Wells et al. | |
| 7,628,932 B2 * | 12/2009 | Lee ................... | H01L 21/30608 216/103 |
| 7,920,770 B2 | 4/2011 | Holzwarth et al. | |
| 7,941,023 B2 | 5/2011 | Patel et al. | |
| 8,159,050 B2 | 4/2012 | Fucsko et al. | |
| 8,437,585 B2 * | 5/2013 | Na ..................... | G02B 6/12002 216/24 |
| 8,791,405 B2 * | 7/2014 | Ji ........................... | G02B 6/122 250/227.11 |
| 2002/0148807 A1 | 10/2002 | Zhao et al. | |

(Continued)

FOREIGN PATENT DOCUMENTS

| | | |
|---|---|---|
| EP | 1850160 A1 | 10/2007 |
| JP | 2009540539 A | 11/2009 |
| JP | 2013524286 A | 6/2013 |

OTHER PUBLICATIONS

Office Action mailed Aug. 2, 2016 in Japan Application No. 2015-558876, 7 pages.

*Primary Examiner* — John M Bedtelyon
(74) *Attorney, Agent, or Firm* — Perkins Coie LLP

(57) ABSTRACT

Disclosed method and apparatus embodiments provide a photonic device with optical isolation from a supporting substrate. A generally rectangular cavity in cross section is provided below an element of the photonic device and the element may be formed from a ledge of the supporting substrate which is over the cavity.

17 Claims, 9 Drawing Sheets

(56) References Cited

U.S. PATENT DOCUMENTS

| | | |
|---|---|---|
| 2004/0258344 A1 | 12/2004 | Fardi et al. |
| 2005/0029536 A1 | 2/2005 | Sugitatsu et al. |
| 2006/0046513 A1 | 3/2006 | Shea et al. |
| 2007/0281493 A1 | 12/2007 | Fucsko et al. |
| 2009/0308839 A1 | 12/2009 | Martini et al. |
| 2010/0059822 A1 | 3/2010 | Pinguet et al. |
| 2011/0133063 A1* | 6/2011 | Ji ................... G02B 6/122 250/227.24 |
| 2011/0188801 A1 | 8/2011 | Zhou |
| 2011/0249938 A1 | 10/2011 | Chen et al. |
| 2011/0260297 A1 | 10/2011 | Lin et al. |
| 2011/0304412 A1 | 12/2011 | Zhang |
| 2012/0138568 A1 | 6/2012 | Na |

* cited by examiner

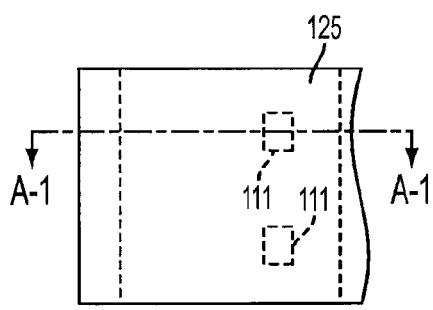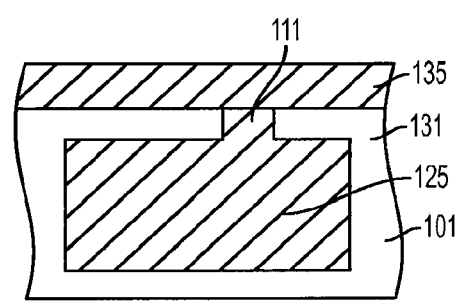
FIG. 4A  FIG. 4A-1
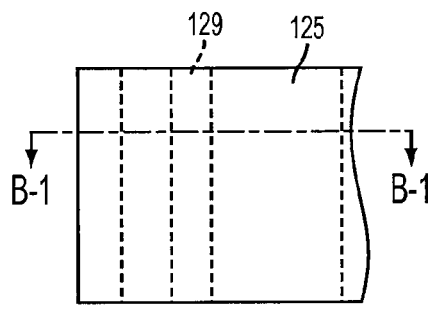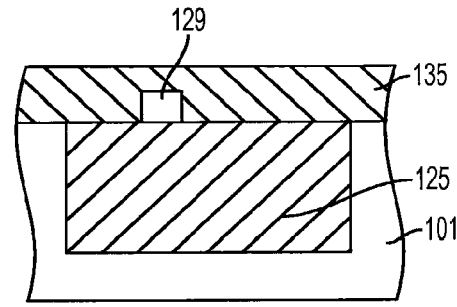
FIG. 4B  FIG. 4B-1

PHOTONIC DEVICE STRUCTURE AND METHOD OF MANUFACTURE

CROSS-REFERENCE TO RELATED APPLICATION

The present application is a divisional of U.S. patent application Ser. No. 13/776,836, filed Feb. 26, 2013, the disclosure of which is incorporated herein by reference in its entirety.

GOVERNMENT RIGHTS

This invention was made with Government support under Agreement Number HR0011-11-9-0009 awarded by DARPA. The Government has certain rights in the invention.

FIELD OF THE INVENTION

Structure and method embodiments described herein relate to forming photonic devices on an integrated circuit substrate with sufficient optical isolation between a photonic device and the substrate material to reduce evanescent coupling between them.

BACKGROUND

There is a current trend to integrate photonic devices and electronic devices on the same semiconductor substrate. A silicon-on-insulator (SOI) substrate can be used as the supporting substrate for such integration. When photonic devices such as optical waveguides are formed a cladding is provided around the core of the waveguide for confining a light wave propagated along the waveguide. The core material has an index of refraction which is larger than that of the cladding. If silicon is used as the core material of a waveguide, having an index of refraction of about 3.47, the waveguide cladding can be formed of a material having a lower index of refraction. For example, silicon dioxide, which has an index of refraction of about 1.54 is often used as the waveguide cladding.

When a silicon-on-insulator substrate is used as the supporting substrate, the cladding material below the waveguide core can be the buried oxide (BOX) insulator of the SOI substrate, which is again typically silicon dioxide, and the waveguide core can be formed from the silicon above the BOX insulator. The BOX cladding functions to prevent optical signal leakage by evanescent coupling from the silicon waveguide core to a supporting silicon substrate of the SOI structure. However, to prevent such evanescent coupling, the BOX cladding material beneath the waveguide core must be relatively thick, for example, greater than 1.0 µm and often 2.0 µm -3.0 µm thick. When the Box cladding material is thick it inhibits heat flow to the underlying silicon, thus diminishing its effectiveness as a heat dissipater, particularly for CMOS circuits which may be formed on the same substrate. In addition, when certain electronic devices, such as high speed logic circuits, are integrated on the same SOI substrate as photonic devices, the BOX of the SOI substrate must be relatively thin, typically having a thickness in the range of 100-200 nm. Such a thin BOX insulator SOI, while providing a good substrate for the electronic devices, is insufficient to prevent evanescent coupling of the silicon waveguide core to the underlying supporting silicon of the SOI substrate, which causes undesirable optical signal loss. In addition, SOI substrates are relatively expensive and sometimes of limited availability.

Accordingly, non-SOI substrates have also been used to integrate electronic and photonic devices on the same substrate. One technique which may be used to prevent evanescent coupling of an optical device to an underlying non-SOI substrate is described in U.S. Pat. No. 7,920,770. In this patent, a deep isolation trench is etched in the substrate below a fabricated optical device. The etching described provides a trench which is formed in a generally curved shape below the optical device. As noted, an underlying cladding material for a photonic device, such as a waveguide core, must be at least 1 µm thick, and is preferably 2.0 µm-3.0 µm thick. It should also extend at that depth laterally past each side edge of the photonic device by at least 1 µm. However, to meet the cladding depth criteria a curved trench would require a lateral extent past the side edges of a photonic device of greater than 1 µm. The larger the lateral extent of the curved trench beyond the side edge of a photonic device, the greater substrate real estate which must be provided for forming the photonic device. The '770 patent also discloses that an additional optical device fabrication material is provided over the substrate for formation of an optical device.

What is needed is a non-SOI substrate suitable for forming both CMOS and photonic devices which provides a generally rectangular shaped lower cladding, as well as a simplified method of forming photonic devices and underlying cladding. A substrate structure which does not require the presence of an additional optical device fabrication material over a non-SOI substrate is also desired.

BRIEF DESCRIPTION OF THE DRAWINGS

FIG. 4A and 4A-1 illustrate a cross-section and planar view of a portion of the FIG. 1 embodiment;

FIG. 4B and 4B-1 illustrate a cross-section and planar view of another portion of the FIG. 1 embodiment;

DETAILED DESCRIPTION OF THE INVENTION

An embodiment described herein provides a photonic device, e.g., a waveguide which has a core formed from semiconductor substrate material, and an associated lower cladding material provided in a cavity of the substrate material. The cavity is located below the photonic device. An embodiment of a method of forming the photonic device and underlying cladding is also described.

Embodiments described herein also provide a photonic device, e.g., a waveguide, over a semiconductor substrate in which a lower cladding of a generally rectangular shape is formed in the substrate.

The various embodiments described herein provide a non-SOI substrate which is suitable for CMOS and photonic device integration.

Figure 1:
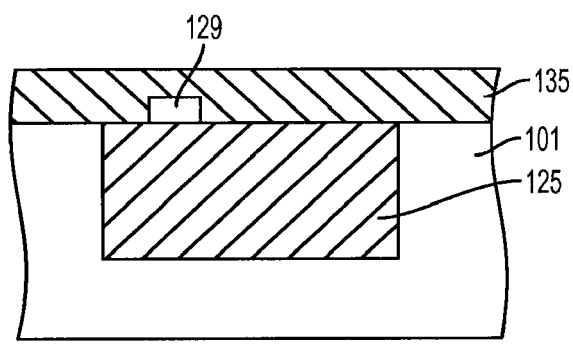
FIG. 1 illustrates in cross-section one embodiment of a photonic device fabricated over a substrate.

FIG. 1 depicts one structural embodiment of the invention in which a portion of a semiconductor substrate 101 has an oxide, e.g., silicon dioxide, filled cavity 125 acting as a lower cladding for a photonic device. The photonic device shown in FIG. 1 is a waveguide having as an element thereof a waveguide core 129. The oxide filled cavity 125 has a generally rectangular shape in cross section. The photonic device further includes an upper cladding in the form of an oxide 135, e.g., silicon dioxide formed on the sides and over the waveguide core 129. The oxide 135 formed over waveguide core 129 may be part of an interlayer dielectric (ILD) structure which is formed as part of a CMOS and photonics circuit interconnect metallization, as described in detail below.

The waveguide core 129 is formed from a ledge portion 131 (FIG. 3K) of the substrate 101 which is produced during the etch of the substrate 101 to produce the generally rectangular shape for oxide filled cavity 125. Since the waveguide core 129 is formed from the same semiconductor material in which the oxide filled cavity 125 is formed, no additional processing steps are required to form an additional photonic device fabrication layer over substrate 101.

Figure 2:
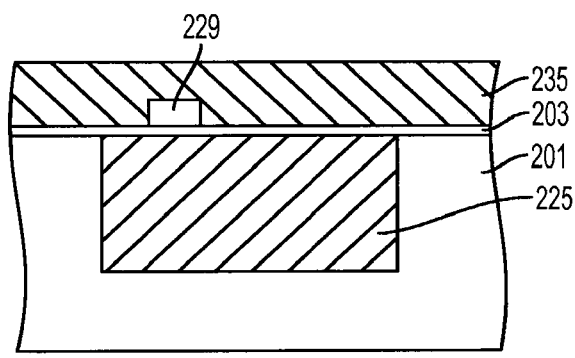
FIG. 2 illustrates in cross-section another embodiment of a photonic device fabricated over a substrate.

FIG. 2 depicts another embodiment in which a substrate 201 is also fabricated to produce an oxide filled cavity 225 of generally rectangular shape. The oxide filled cavity 225 acts as a lower cladding for a waveguide which includes a waveguide core 229 which is provided over an oxide material 203, e.g., silicon dioxide, which acts as a substrate 201 protection layer. An upper cladding on the sides and over waveguide core 229 is provided by an oxide 235, e.g., silicon dioxide, formed over waveguide core 229 which may be part of an interlayer dielectric (ILD) structure which is formed as part of a CMOS and photonic circuit interconnect metallization. Unlike the FIG. 1 embodiment, the FIG. 2 embodiment has a waveguide core 229 formed from a photonics fabrication layer which is provided over oxide layer 225 and an oxide spacer layer 203.

Figure 3A:
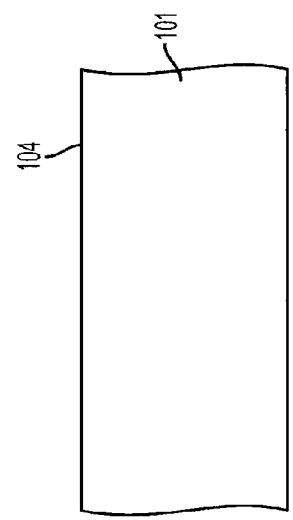
FIGS. 3A through 3O illustrate in cross-section a processing sequence which can be used to form the FIG. 1 embodiment.
Figure 3B:
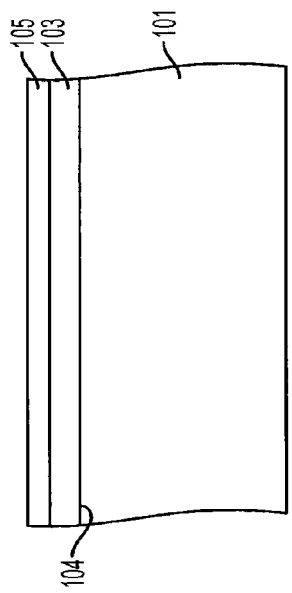
Figure 3C:
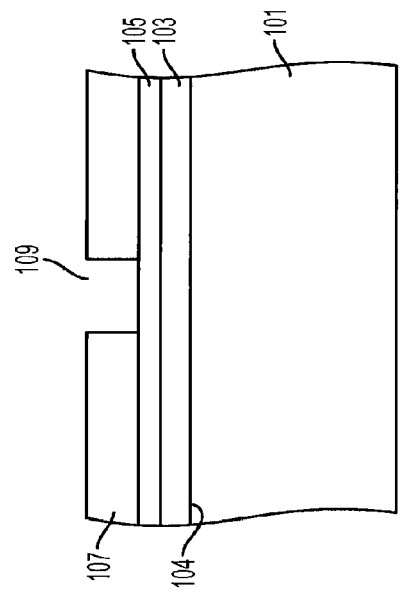
Figure 3D:
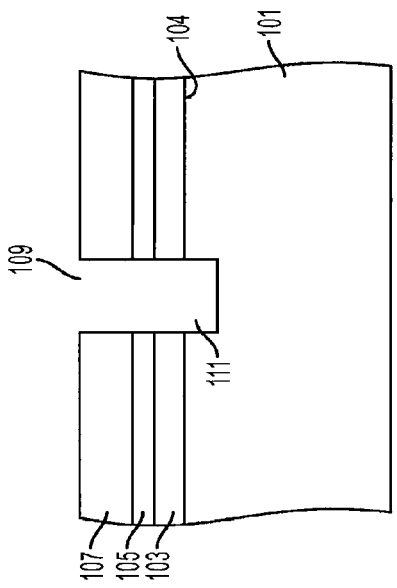
Figure 3E:
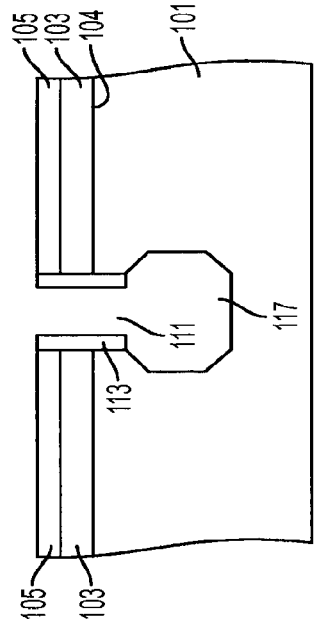
Figure 3F:
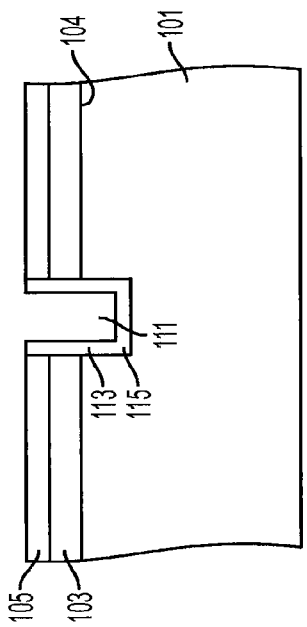
Figure 3G:
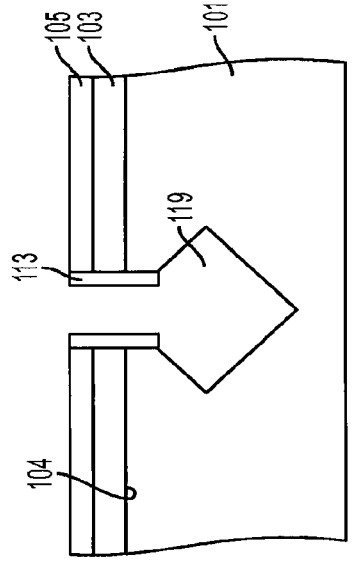
Figure 3H:
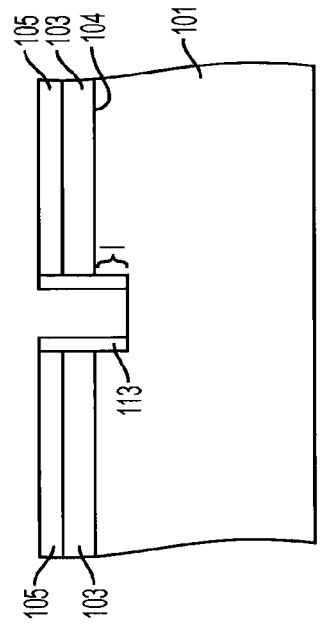
Figure 3I:
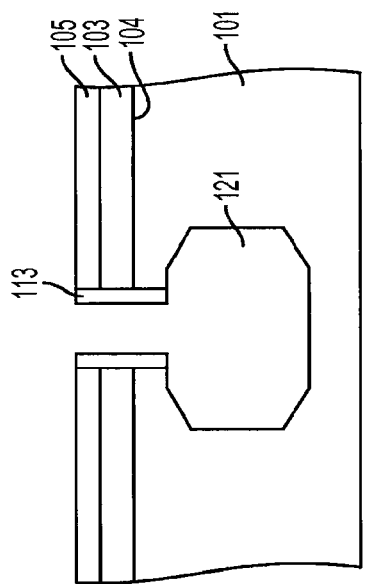
Figure 3K:
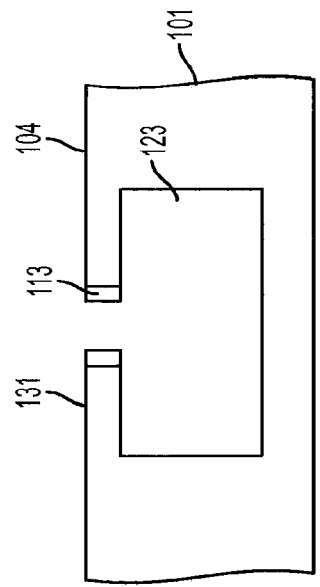
Figure 3J:
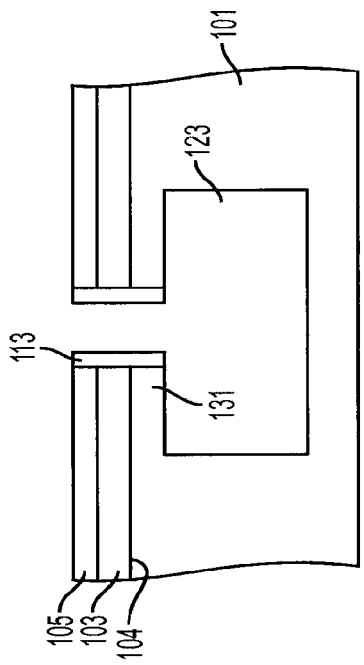
Figure 3L:
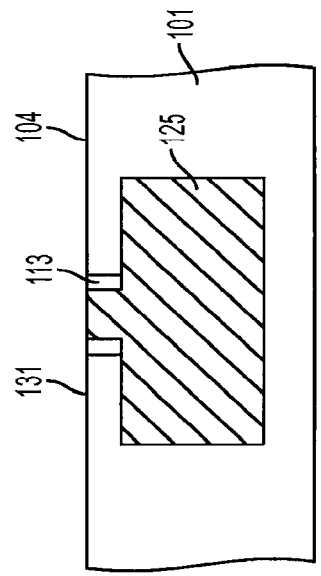
Figure 3M:
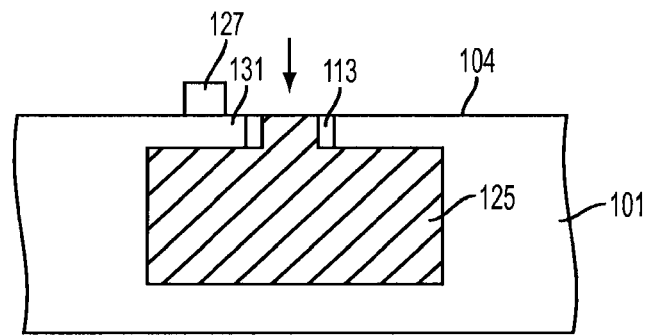
Figure 3N:
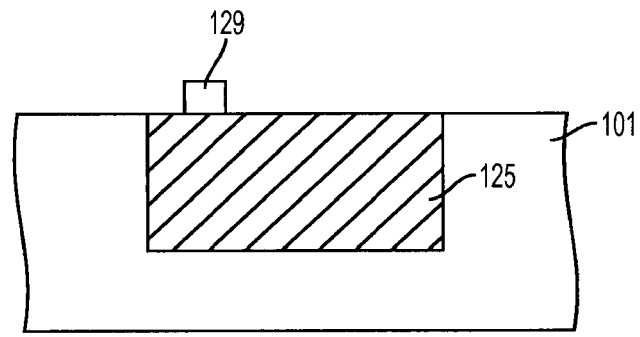
Figure 3O:
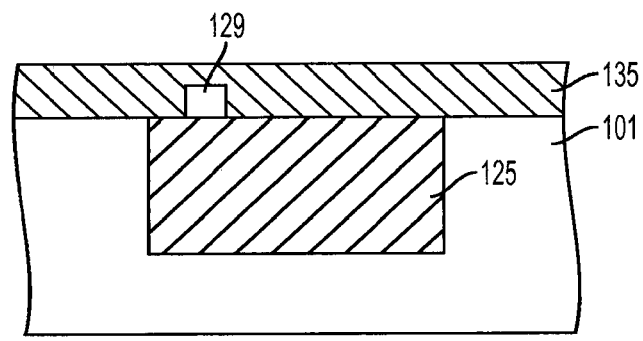

FIGS. 3A through 3O show a processing sequence for forming the FIG. 1 structure starting with a semiconductor substrate 101. The substrate material may be a single crystalline silicon semiconductor material. However, the processing sequence may be used with other substrate materials suitable for CMOS and photonic device fabrication, such as polycrystalline silicon, silicon carbide, and silicon germanium, among others. The processing sequence illustrated in FIGS. 3A through 3O can be performed before, after or during the processing of substrate 101 to form CMOS devices on another portion of the same substrate 101.

FIG. 3A shows a portion of semiconductor substrate 101 having an upper surface 104 as the starting point of the process. As shown in FIG. 3B, a layer of a protective material 103 is formed on the top surface of substrate 101. The protective material may be an oxide, for example, silicon dioxide ($SiO_2$), grown or deposited on the top surface of substrate 101 and protects substrate 101 from subsequent processing steps. A hard mask material 105, for example, silicon nitride ($Si_3N_4$) is then deposited on the protective material 103.

As shown in FIG. 3C, a patterned photoresist material 107 is next formed over the hard mask material 105, the pattern defining an opening 109 in the photoresist material 107.

As shown in FIG. 3D, the opening 109 is used to etch through the hard mask material 105, protective material 103 and into the substrate 101, forming a substrate trench 111 in an upper surface 104 of substrate 101. The etch to form trench 111 and which etches through the protective layer 103 and hard mask 105, can be an anisotropic dry etch. The photoresist material 107 is then removed.

FIG. 3E illustrates the formation of a protective liner 113 at the sides of trench 111, and at sides of protective material 103 and hard mask material 105 at the opening 109. The protective liner 113 may be formed of an oxide, for example, $SiO_2$ which can be applied by deposition. Since an area to be protected for subsequent processing is at the sidewalls of substrate trench 111, the protective liner 113, instead of being applied by deposition, may be grown on trench 111 sidewalls and bottom. In either case, and as shown in FIG. 3F, the bottom of protective liner 113 in trench 111 is removed by an anisotropic wet or dry etch leaving the protective liner 113 on the sides of trench 111. If the protective liner 113 is applied by deposition, the protective liner 113 is also left on the sides of opening 109 in the protective material 103 and hard mask material 105. The depth of substrate trench 111, which also determines the length l (FIG. 3F) of the protective liner 113 along the sides of trench 111, is selected based on a desired thickness of a subsequently produced ledge portion 131 (FIG. 3J) of substrate 101 used to form an element of a photonic device as described below. For example, if the desired thickness of a photonic device element, such as a waveguide core 129, has a value in the range of about 30 nm to about 1 µm, then the depth of trench 111 and consequent length l of the protective liner 103 along the sides of trench 111 will likewise have the same value in the corresponding range of about 30 nm to about 1 µm.

After formation of protective liner 113, and as shown in FIG. 3G, an isotropic wet etch of substrate 101 is initiated through opening 109 and trench 111 which begins to form a cavity 117 in substrate 101. The etchant will etch the silicon 101 substrate but not the protective liner 113 or protective material 103. In order to help minimize the substrate 101 area occupied by a photonic device and its associated underlying cladding, a generally rectangular etch cavity is desired. The manner in which a generally rectangular cavity etch of a silicon substrate can be achieved, and appropriate etchants for this purpose, are described in U.S. Pat. Nos. 7,628,932 and 8,159,050 which are incorporated by reference herein in their entirety.

A silicon etch is first performed within trench 111 to open desired silicon planes of substrate 101 prior to a wet etch. The wet etchant may be selected based on desired cavity shape, the shape of desired ledge portion 131 (FIG. 3J) of substrate 101 and the crystal orientation of the substrate. If <100> silicon is used, the wet etchant can be a hydroxide, for example $NH_4OH$ or tetramethylammonium hydroxide (TMAH), though $NH_4OH$ will form a shaped cavity faster than TMAH. The etch rates of substrate 101 will differ with the direction of the silicon planes. FIG. 3G illustrates the start of the etching in which a generally hexagonal shaped cavity starts being formed. Further etching produces a generally diamond shaped cavity 119, as shown in FIG. 3H. Still further etching produces the laterally elongated generally hexagonal shaped cavity 121 in FIG. 3I. In order to shape the FIG. 3I cavity into a generally rectangular shape a different etchant may be used to create square corners for the cavity 121. Thus, a buffered fluoride etch solution having a volumetric ratio of $NH_4F:QEII:H_2O_2$ of about 4:2:3 may be used to further isotropically etch the FIG. 3I cavity 121 to form cavity corners which are more square and produce the generally rectangular shaped cavity 123 shown in FIG. 3J. QEII is a commercial etching solution available from Olin Microelectronics Materials (Newalk, Conn.). The generally rectangular shaped cavity 123 creates a ledge portion 131 of substrate material over the cavity 123.

Following the wet etch to establish the generally rectangular cross-sectional shaped cavity 123 shown in FIG. 3J, the protective material 103 and hard mask material 105 are removed by dry etch or chemical mechanical polishing to expose the upper surface 104 of substrate 101. The substrate 101 is then washed leaving substrate 101 with the generally rectangular cavity 123, ledge portion 131, and a portion of protective liner 113 as shown in FIG. 3K.

As shown in FIG. 3L the cavity 123 is next filled with an oxide material 125, for example, silicon dioxide. The oxide material 125 will act as a lower cladding for a subsequently formed photonic device and may be formed by deposition, spin coating, or thermal growth.

FIG. 3M shows the formation of a patterned photoresist material 127 over the substrate 101 ledge portion 131. The photoresist material acts as a mask for an anisotropic etch of the substrate 101 and ledge portion 131, which stops at the upper surface of oxide 125 providing an element of a photonic device in the form of waveguide core 129, FIG. 3N. The waveguide core 129 is supported on the upper surface of oxide material 125, which provides a lower cladding for waveguide core 129. As shown in FIG. 3O, an upper cladding material in the form of an oxide 135, e.g., silicon dioxide, is next formed on the sides and over the silicon waveguide core 129, forming the completed photonic waveguide shown in FIG. 1.

Although the oxide material 125 is described in conjunction with FIG. 3L as formed in the generally rectangular cavity 123 before formation of the waveguide core device 129, it is also possible to form the oxide material 125 in cavity 123 after formation of waveguide core 129.

FIGS. 4A and 4A-1, depict respective planar and cross-sectional (along line A-1, A-1) views of a portion of the FIG. 1 structure. The planar view of FIG. 4A shows in dotted lines structures below the oxide 135. The cross-sectional view FIG. 4A-1 is taken through the location of a trench 111 in the substrate 101 through which etching of the generally rectangular cavity 123 occurs. The oxides 125 and 135 are both illustrated in the FIG. 4A-1 cross section and oxide 125 is also illustrated by dotted lines in the FIG. 4A planar view. As shown in FIG. 4A, a plurality of trenches 111 are formed which are spaced in a linear direction along substrate 101 so a linear extending underlying cladding oxide 125 is provided for a linear extending waveguide core 129.

FIGS. 4B and 4B-1 depict respective planar and cross-sectional (along line B-1, B-1) views of another portion of the FIG. 1 structure. The planar view of FIG. 4B shows in dotted lines structures below oxide 135. The cross-sectional view is taken through a linear extending waveguide core 129 and shows the waveguide core 129 surrounded by the cladding oxides 125, 135 in the FIG. 4B-1 cross-section and linear extending oxide 125 and waveguide core 129 are shown by dotted lines in the FIG. 4B planar view. The upper cladding oxide 135 can be part of an interlayer dielectric (ILD) structure used to support a metallization pattern for CMOS and photonic device connections, in the manner described below in connection with FIG. 6.

The FIG. 1 embodiment provides an optical device in the form of a waveguide having a core 129 formed of substrate material. The waveguide has a lower cladding formed in a generally rectangular cavity, as viewed in cross section, of the substrate and provides an easily fabricated structure, while reducing the amount of substrate 101 real estate required for its formation, as compared to a curved cavity.

FIGS. 5A through 5E depict in cross-section a processing sequence which may be used to form the FIG. 2 embodiment.

Figure 5C:
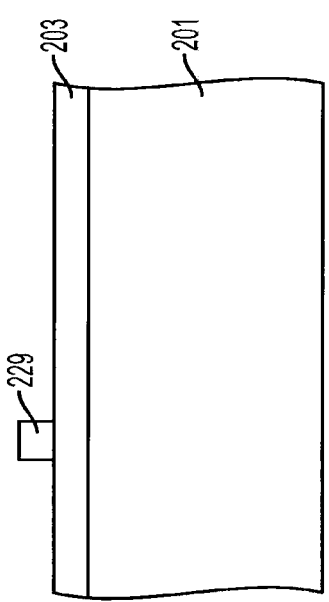
FIGS. 5A through 5F illustrate in cross-section a processing sequence which can be used to form the FIG. 2 embodiment; and, FIG. 6 illustrates a cross-section of a substrate in accordance with the FIG. 1 embodiment which has both electronic devices and photonic devices fabricated thereon.
Figure 5D:
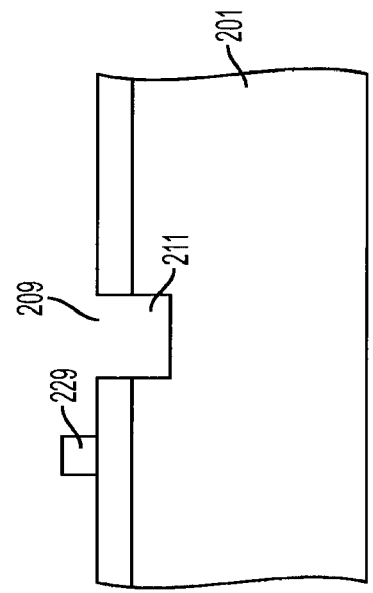
Figure 5A:
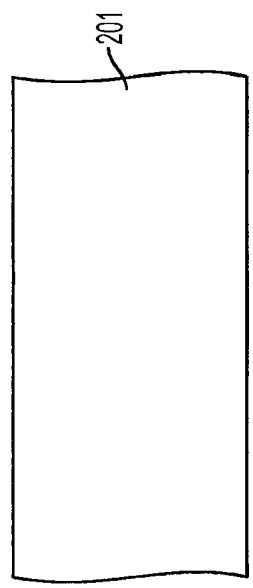

FIG. 5A illustrates a semiconductor substrate 201 which can be of the same material as substrate 101, as one example, single crystal silicon.

Figure 5B:
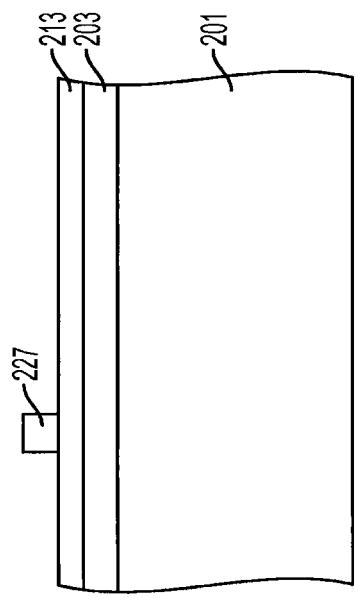

FIG. 5B illustrates formation of a protective oxide material 203, e.g., silicon dioxide, over substrate 201. Oxide material 203 can be grown or formed by deposition or spin coating. A photonic device fabrication material 213 is formed over the oxide material 203, for example, by deposition. Photonic device fabrication material 213 can be single crystalline silicon, polycrystalline silicon, amorphous silicon, or other material suitable for forming photonic devices, such as $Si_3N_4$, $Si_xN_y$, $SiO_xN_y$, SiC, $Si_xGe_y$, GaAs, AlGaAs, InGaAs, or InP, where x and y are positive integers, (e.g., 1, 2, etc.). The material 213 is selected such that it has a higher index of refraction than later formed surrounding cladding materials. FIG. 5B also illustrates a patterned photoresist 227 provided over the photonic device fabrication material 213.

FIG. 5C illustrates the FIG. 5B structure after the photonic device fabrication material 213 is etched using a web or dry anisotropic etch and using the photoresist 227 as a mask and after removal of the photoresist 227. An element of a photonic device, e.g., waveguide core 229, formed of the photonic device fabrication material 203, remains over the oxide material 203.

Figure 5E:
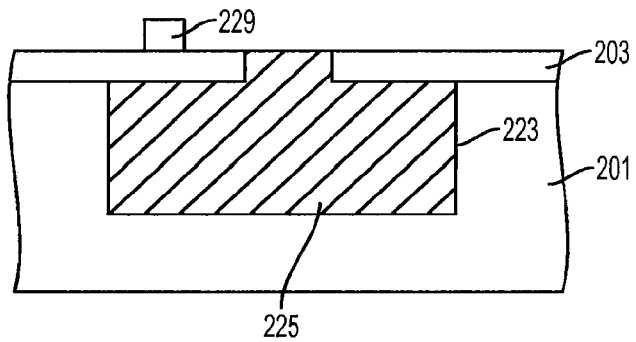
Figure 5F:
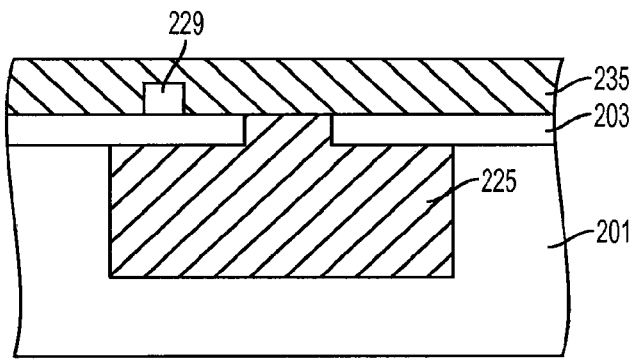

Next, as shown in FIG. 5D, an opening 209 is etched into oxide material 203 using a patterned photoresist (not shown). The opening 209 partially extends into substrate 201 forming a trench 211 in the substrate 201. Following this, the substrate 201 is further etched using the techniques and etching materials described above with respect to FIGS. 3G through 3K to form a generally rectangular cavity 223 in the substrate which extends laterally past side edges of waveguide core 229. The etchant will etch the silicon substrate 201, but not protective material 203. The cavity 223 and opening 209 are then filled with an oxide 225, e.g., silicon dioxide, formed by growth, deposition or spin coating, as shown in FIG. 5E. As shown in FIG. 5F, an oxide 235 e.g., silicon dioxide, is formed over the waveguide core 229 such that an oxide lower and upper cladding 225, 235 completely surrounds the waveguide core 229. The oxide 235 can be separately formed, or can be part of an interlayer dielectric (ILD) used to support a metallization pattern for CMOS and photonic device connections, in the manner described below in connection with FIG. 7.

Figure 6:
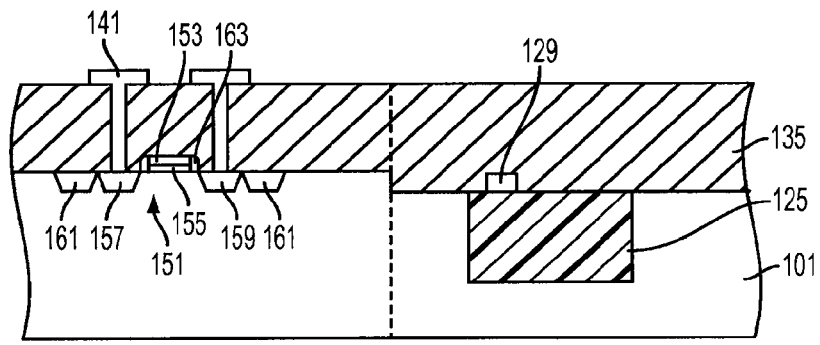

FIG. 6 shows the FIG. 1 embodiments formed on a substrate 101 which has CMOS circuits formed on one portion of the substrate 101 and a photonics device, e.g., a waveguide, formed on another portion. FIG. 6 also shows that the upper cladding oxide 135 may be formed as part of an interlayer dielectric (ILD) structure supporting one or more metallization layers 141. The CMOS circuits are exemplified by a MOSFET transistor 151 having a gate 153 with sidewall spacers 163 formed over a gate oxide 155 and having source 157 and drain regions 159, and isolated by shallow trench isolation structures 161. The CMOS devices, e.g., transistor 151, can be formed on substrate 101 before, after or during formation of the waveguide core 129 and associated oxide filled cavity 125.

Figure 7:
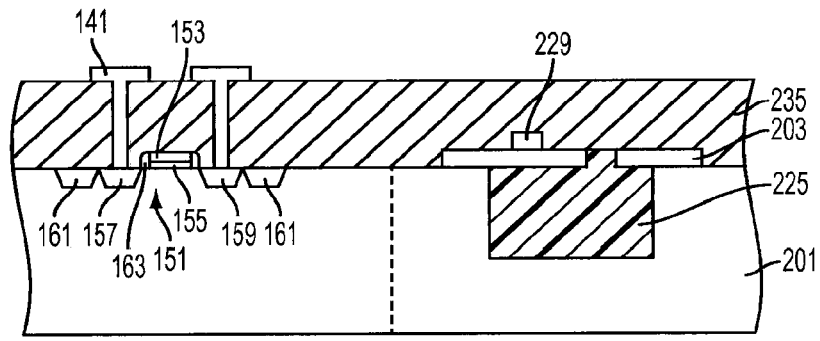
FIG. 7 illustrates a cross-section of a substrate in accordance with the FIG. 2 embodiment which has both electronic devices and photonic devices fabricated thereon.

FIG. 7 shows the FIG. 2 embodiment formed on a substrate 201 which has CMOS Circuits formed on one portion of substrate 201 and a photonic device, e.g., a waveguide formed on another portion. FIG. 7 also shows that the upper cladding oxide 135 may be formed as part of an interlayer dielectric (ILD) structure supporting one or more metallization layers 141. The CMOS circuits are exemplified by a MOSFET transistor 151 having a gate 153 with sidewall spacers 163 formed over a gate oxide 155 and having source 157 and drain regions 159, and isolated by shallow trench isolation structures 161. The CMOS devices, e.g., transistor 151, can be formed on substrate 201 before, after or during formation of the waveguide core 229 and associated oxide filled cavity 225.

As seen in FIGS. 6 and 7, the embodiments illustrated in FIGS. 1 and 2 can be part of a common substrate 101 (201) on which both CMOS circuits and photonic devices and circuits are formed.

While method and apparatus embodiments which are examples of the invention have been described above, the invention is not limited to the specifics of those embodiments as changes can be made without departing from the spirit or scope of the invention. For example, while a waveguide having an associated core 129 (229) and surrounding upper and lower oxide cladding have been described and illustrated, other photonic devices can also be constructed using silicon from the substrate 101 (FIG. 1), or from the photonics fabricating material (FIG. 2) such as, optical modulators, filters, gratings, taps, light detectors, light emitters and other photonic devices. Also, transistor 151 is just one example of various electronic devices and circuits which can be formed in the CMOS area of substrate 101 (201). Also, although a silicon substrate is described in connection with the FIG. 1 embodiment the substrate 101 can be formed of other materials suitable for forming an element of a photonic device. Likewise, the silicon substrate 201 described in connection with FIG. 2 may be formed of other materials suitable for supporting a photonic device.

Accordingly, the invention is not limited by the foregoing description, but is only limited by the scope of the appended claims.

What is claimed as new and desired to be protected by Letters Patent of the United States is:

1. A photonic structure comprising:
   a substrate comprising a substrate material suitable for forming a photonic device element, the substrate having an upper surface;
   a photonic device element formed from the substrate such that the photonic device element and the substrate are the same material; and
   a cavity in the substrate below the photonic device element and containing a cladding material for optically decoupling the photonic device element from the substrate, the cavity having a generally rectangular cross-sectional shape with side surfaces substantially perpendicular to the upper surface of the substrate.

2. A photonic structure as in claim 1, wherein the substrate material comprises a semiconductor material.

3. A photonic structure as in claim 2, wherein the semiconductor material comprises silicon.

4. A photonic structure as in claim 3, wherein the silicon comprises single crystal silicon.

5. A photonic structure as in claim 1, wherein the cladding material comprises an oxide.

6. A photonic structure as in claim 5, wherein the oxide comprises silicon dioxide.

7. A photonic structure as in claim 1, further comprising an upper cladding material over the photonic device element.

8. A photonic structure as in claim 7, wherein the upper cladding material comprises an oxide.

9. A photonic structure as in claim 8, wherein the oxide comprises silicon dioxide.

10. A photonic structure as in claim 7, wherein the upper cladding material comprises a part of an interlayer dielectric (ILD) of a metallization structure.

11. A photonic structure as in claim 1, wherein the photonic device element is a waveguide core.

12. A photonic structure comprising:
    a substrate having a generally rectangular cavity in cross section and containing a material for optically decoupling a photonic element from the substrate, the cavity having a lower surface substantially parallel to an upper surface of the substrate; and
    the photonic element formed above the cavity, wherein the photonic element is a part of the substrate.

13. The photonic structure as in claim 12, wherein the photonic element is a waveguide core.

14. The photonic structure as in claim 12, further comprising an upper cladding material over the photonic element.

15. The photonic structure as in claim 12, wherein the substrate comprises a semiconductor material.

16. The photonic structure as in claim 15, wherein the semiconductor material comprises silicon.

17. The photonic structure as in claim 16, wherein the silicon comprises single crystal silicon.

* * * * *